(12) United States Patent
Ye et al.

(10) Patent No.: US 12,191,841 B2
(45) Date of Patent: Jan. 7, 2025

(54) ACOUSTIC WAVE DEVICE AND FORMING METHOD THEREOF

(71) Applicant: EPISTAR CORPORATION, Hsinchu (TW)

(72) Inventors: Wei-Tsuen Ye, Hsinchu (TW); Ta-Cheng Hsu, Hsinchu (TW); Wei-Shou Chen, Hsinchu (TW); Chung-Jen Chung, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 781 days.

(21) Appl. No.: 17/308,146

(22) Filed: May 5, 2021

(65) Prior Publication Data
US 2021/0351761 A1    Nov. 11, 2021

(30) Foreign Application Priority Data
May 5, 2020    (TW) ................................ 109114918

(51) Int. Cl.
*H03H 9/17*    (2006.01)
*H03H 3/02*    (2006.01)
*H03H 9/02*    (2006.01)

(52) U.S. Cl.
CPC .............. *H03H 9/175* (2013.01); *H03H 3/02* (2013.01); *H03H 9/02125* (2013.01); *H03H 2003/025* (2013.01)

(58) Field of Classification Search
CPC ........................... H03H 9/175; H03H 9/02125
See application file for complete search history.

(56) References Cited

U.S. PATENT DOCUMENTS

| | | | |
|---|---|---|---|
| 6,998,940 B2 | 2/2006 | Metzger | |
| 2004/0145430 A1* | 7/2004 | Metzger | H03H 3/02 333/191 |
| 2013/0181579 A1* | 7/2013 | Shin | H10N 30/40 310/346 |
| 2015/0033520 A1 | 2/2015 | Riaziat et al. | |
| 2018/0191327 A1* | 7/2018 | Chang | H03H 9/587 |
| 2019/0109561 A1* | 4/2019 | Bahr | H03B 5/30 |
| 2021/0351761 A1* | 11/2021 | Ye | H03H 3/02 |

* cited by examiner

*Primary Examiner* — Bryan P Gordon
(74) *Attorney, Agent, or Firm* — Patterson + Sheridan, LLP

(57) ABSTRACT

A method for forming an acoustic wave device, including steps of: forming an acoustic wave sensing part and an acoustic wave reflecting part, wherein the step of forming the acoustic wave sensing part includes: providing a first substrate, forming a sensing layer on the first substrate, forming a bottom electrode on a side of the sensing layer, and forming a filling layer on the sensing layer and the bottom electrode; and wherein the step of forming the acoustic wave reflecting part includes: providing a second substrate, forming a reflecting element on the second substrate, and forming a cover layer on the reflecting element; joining the acoustic wave sensing part and the acoustic wave reflecting part; removing the first substrate; and forming a top electrode on another side of the sensing layer, wherein the bottom electrode, the top electrode and the reflecting element are arranged correspondingly to each other.

12 Claims, 14 Drawing Sheets

ACOUSTIC WAVE DEVICE AND FORMING METHOD THEREOF

CROSS-REFERENCE TO RELATED APPLICATIONS

This application claims priority to the benefit of Taiwan Patent Application Number 109114918 filed on May 5, 2020, and the entire contents of which are hereby incorporated by reference herein in its entirety.

TECHNICAL FIELD

The embodiment of the present disclosure relates to an acoustic wave device and a forming method thereof, in particular to an acoustic wave device having a multilayer structure and a method for forming the same.

DESCRIPTION OF BACKGROUND ART

Wireless frequency communication equipment (e.g., smartphones) relies on acoustic filters to filter out signals in adjacent frequency bands in order to operate properly in various radio frequencies and bands. In order to meet the requirements of increasingly complex communication apparatus, it is necessary to use filters with different types and compositions of acoustic wave devices for different communication channels and communication device to tune in different ranges of bandwidths.

As communication equipment continues to evolve toward lighter, thinner, shorter, and more fashionable, and as frequency resources become more and more crowded, filters with high-performance acoustic wave devices are becoming more important. Although the existing acoustic wave devices and their formation methods have generally met the needs of filters and various communication devices, they are not yet satisfactory in all aspects.

SUMMARY OF THE APPLICATION

A method for forming an acoustic wave device, including steps of: forming an acoustic wave sensing part and an acoustic wave reflecting part, wherein the step of forming the acoustic wave sensing part includes: providing a first substrate, forming a sensing layer on the first substrate, forming a bottom electrode on a side of the sensing layer, and forming a filling layer on the sensing layer and the bottom electrode; and wherein the step of forming the acoustic wave reflecting part includes: providing a second substrate, forming a reflecting element on the second substrate, and forming a cover layer on the reflecting element; joining the acoustic wave sensing part and the acoustic wave reflecting part; removing the first substrate; and forming a top electrode on another side of the sensing layer, wherein the bottom electrode, the top electrode and the reflecting element are arranged correspondingly to each other.

A method for forming an acoustic wave device, including steps of: forming an acoustic wave part and a base part, wherein the step of forming the acoustic wave part includes: providing a first substrate, forming a sensing layer on the first substrate; forming a bottom electrode on a side of the sensing layer, forming a first filling layer on the bottom electrode, forming a reflecting element on the first filling layer, and forming a cover layer on the reflecting element; and wherein the step of forming the base part includes: providing a second substrate, and forming a second filling layer on the second substrate; joining the acoustic wave part and the base part; removing the first substrate; and forming a top electrode on another side of the sensing layer, wherein the bottom electrode, the top electrode and the reflecting element are arranged correspondingly to each other.

A method for forming an acoustic wave device, including steps of: providing a substrate; forming a reflecting element on the substrate; forming a cover layer on the reflecting element; forming a bottom electrode on the cover layer, wherein the bottom electrode is arranged above and corresponding to the reflecting element, forming a sensing layer on the cover layer; and forming a top electrode on the sensing layer, wherein the top electrode is arranged correspondingly to the bottom electrode.

An acoustic wave device, including: a substrate; a reflecting element disposed on the substrate; a bottom electrode disposed on and corresponding to the reflecting element; a sensing layer disposed on the bottom electrode; and a top electrode disposed on the sending layer and corresponding to the bottom electrode; wherein the reflecting element includes multiple acoustic wave reflective material layers, one of the acoustic wave reflective material layers includes a middle portion and a surrounding portion, wherein the middle portion has a first thickness, the surrounding portion has a second thickness, and the first thickness is greater than the second thickness

BRIEF DESCRIPTION OF THE DRAWINGS

The embodiments of the present disclosure will be described in detail below in conjunction with the accompanying drawings. It should be noted that, according to standard practices in the industry, various features are not drawn to scale and are only used for illustration and illustration. In fact, the size of the element can be arbitrarily enlarged or reduced to clearly show the characteristics of the embodiment of the present disclosure.

DETAILED DESCRIPTION OF PREFERRED EMBODIMENTS

Figure 1A:
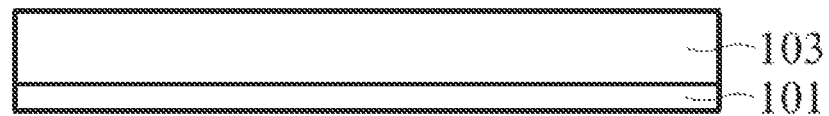
FIGS. 1A to 1D are cross-sectional views illustrating various stages in the forming process of the acoustic wave sensing part according to some embodiments of the present disclosure.

The following describes the acoustic wave device and its manufacturing method of an embodiment of the present application. However, it should be understood that embodiments of the present application provide many suitable inventive concepts that can be implemented in a wide variety of specific contexts. The particular embodiments disclosed are intended only to illustrate a particular method of making and using the disclosure and are not intended to limit the scope of the application. Further, the same symbols are used in the drawings and descriptions of the embodiments of the present application to indicate identical or similar parts.

FIGS. 1A to 1D are cross-sectional views illustrating various stages in the forming process of the acoustic wave sensing part according to some embodiments of the present disclosure. Referring to FIG. 1A, a first substrate 101 is provided, and a sensing layer 103 is formed on the first substrate 101. In some embodiments, the material of the first substrate 101 may include a single crystal material, such as silicon, germanium, sapphire, or compound semiconductors such as silicon carbide, gallium nitride, aluminum gallium nitride, or a combination of the foregoing. In other embodiments, the material of the first substrate 101 includes glass, metal, plastic, ceramic, or a combination of the foregoing.

In some embodiments, the sensing layer 103 may be formed of a piezoelectric material. The piezoelectric material may include semiconductor material such as aluminum nitride, a metal oxide such as zinc oxide, or a piezoelectric ceramic material such as lead zirconate titanate (PZT). According to some embodiments, the sensing layer 103 may be a monocrystalline layer. According to other embodiments, the sensing layer 103 may be a polycrystalline layer. In some embodiments, the sensing layer 103 is a single crystal layer, and the sensing layer 103 can be formed by an epitaxial process such as metal organic chemical vapor deposition (MOCVD), molecular beam epitaxy (MBE), or liquid phase epitaxy (LPE), vapor phase epitaxy (VPE), or a combination of the foregoing. In some embodiments, the sensing layer 103 is a polycrystalline layer, and the sensing layer 103 can be formed by pulsed laser deposition (PLD), sputtering deposition, or a combination of the foregoing.

In addition, when the sensing layer 103 is a single crystal layer, a buffer layer (not shown) may be formed on the first substrate 101, and then the sensing layer 103 may be formed on the buffer layer. In addition, when the material of the first substrate 101 is sapphire, a sacrificial layer (not shown) may be additionally formed on the first substrate 101 wherein the sacrificial layer can be removed subsequently by laser lift-off (LLO) process, and then a buffer layer may be formed on the sacrificial layer.

Figure 1B:
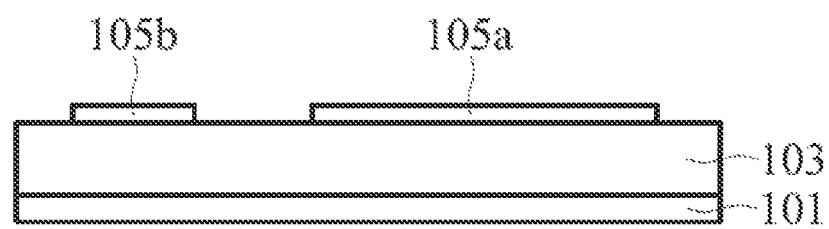

Referring to FIG. 1B, a first bottom electrode 105a and a second bottom electrode 105b are formed on part of one side of the sensing layer 103. Specifically, according to some embodiments, the material of the bottom electrodes may be formed on one side of the sensing layer 103, and then the bottom electrodes may be patterned by lithography process and etching process to form the first bottom electrode 105a and the second bottom electrode 105b shown in FIG. 1B. In some embodiments, the first bottom electrode 105a and the second bottom electrode 105b may include titanium, tungsten, aluminum, rubidium, silver, copper, gold, molybdenum, platinum, or alloys thereof, or a combination of the foregoing. In some embodiments, the first bottom electrode 105a and the second bottom electrode 105b include titanium tungsten alloy.

Figure 1C:
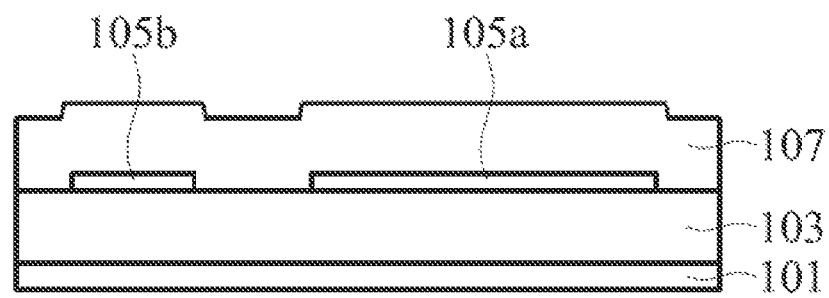
Figure 1D:
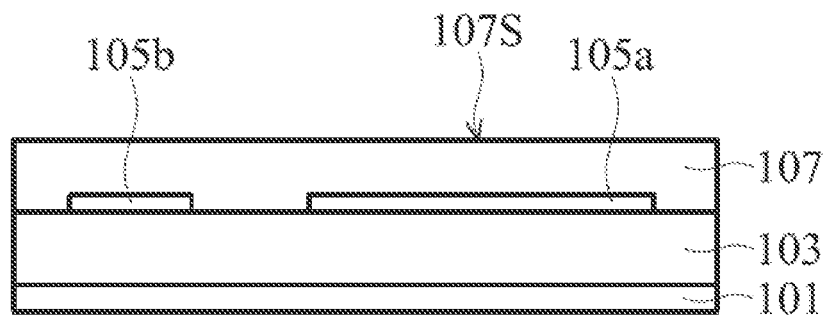
Figure 1E:
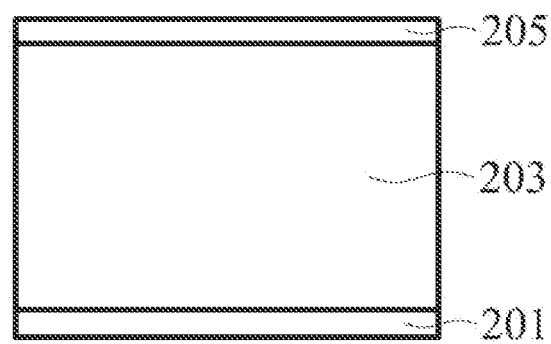
FIGS. 1E to 1J are cross-sectional views illustrating various stages in the forming process of the acoustic wave reflecting part according to some embodiments of the present disclosure.

Referring to FIGS. 1C and 1D, a first filling material is formed on the sensing layer 103, which covers side portions and top portions of the first bottom electrode 105a and the second bottom electrode 105b to form a filling layer 107. In some embodiments, the first filling material may be a low acoustic impedance material. The low acoustic impedance material may include metal or non-metal. For example, the metal includes aluminum, titanium, or a combination thereof, and the non-metal includes semiconductor materials such as silicon, or dielectric materials such as silicon oxide ($SiO_2$), silicon nitride ($Si_3N_4$), silicon oxynitride (SiON), titanium oxide ($TiO_2$), magnesium nitride (MgN), or a combination of the foregoing. Next, as shown in FIG. 1D, when the upper surface of the filling layer 107 is not flat, a planarization process may be performed as needed to remove part of the filling layer 107 to form a flat first bonding surface 107S. In some embodiments, the planarization process may include a chemical mechanic polishing (CMP) process, a mechanical polishing process, a grinding process, an etching process, or a combination of the foregoing.

FIGS. 1E to 1J are cross-sectional views illustrating various stages in the forming process of the acoustic wave reflecting part according to some embodiments of the present disclosure. FIGS. 1E to 1H show the process flow in some embodiments, in which the reflecting element 20a is formed on the second substrate 201 by a lift-off process. Although FIGS. 1E to 1H only show that a single reflecting element 20a is formed on the second substrate 201, any number of reflecting elements can be formed on the second substrate 201, which will be described in subsequent drawings.

In some embodiments, the material of the second substrate 201 may include single crystal material such as silicon, germanium, sapphire, or compound semiconductors such as silicon carbide, gallium nitride, aluminum gallium nitride, or a combination of the foregoing. In other embodiments, the material of the second substrate 201 includes glass, metal, plastic, ceramic or other materials.

Figure 1F:
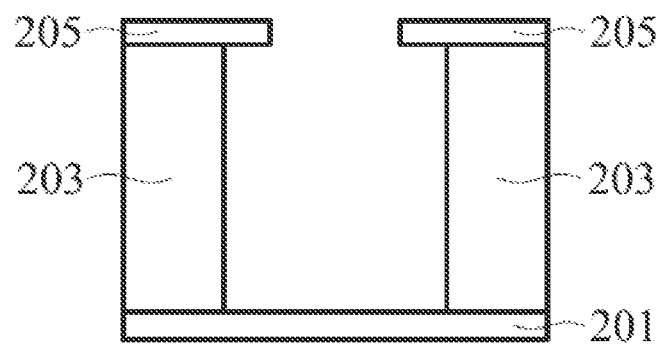

According to some embodiments, the lift-off process includes forming one photoresist layer on the second substrate 201. In some embodiments, the photoresist layer may include a first photoresist layer 203 and a second photoresist layer 205, and the first photoresist layer 203 and the second photoresist layer 205 have different etching selectivity. Specifically, in some embodiments, a photoresist layer like the first photoresist layer 203 or the second photoresist layer 205 may be formed on the second substrate 201 first, and the photoresist layer like the first photoresist layer 203 or the second photoresist layer 205 may be patterned to expose part of the second substrate 201 as shown in FIG. 1F. In some embodiments, the etching rate of the lower first photoresist layer 203 can be greater than the etching rate of the upper second photoresist layer 205 so that the patterned first photoresist layer 203 is retracted relatively to the second photoresist layer 205 to form an undercut structure as shown in FIG. 1F.

In some embodiments, the photoresist layer like the first photoresist layer 203 or the second photoresist layer can be formed by spin coating process, printing process, or a combination of the foregoing. In addition, the photoresist layer like the first photoresist layer 203 or the second photoresist layer 205 can be patterned by the lithography process. In some embodiments, the lithography process may include soft baking, hard baking, mask aligning, exposure, post-exposure baking, and developing photoresist, rinsing, drying or other process.

Figure 1G:
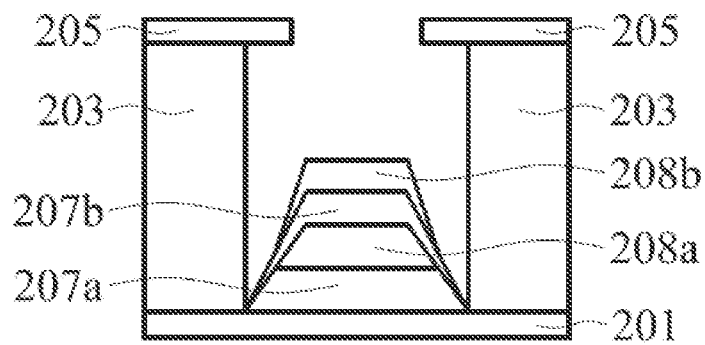

Next, referring to FIG. 1G, after forming the patterned photoresist layer, the forming process of the acoustic wave device further includes alternately depositing a multiple acoustic wave reflective material layers, such as low acoustic wave reflective material layer and a high acoustic wave reflective material layer on an exposed part of the second substrate 201. In some embodiments, the low acoustic wave reflective material layers 207a and 207b may include low acoustic impedance material, and the high acoustic wave reflective material layers 208a and 208b may include high acoustic impedance material. The low acoustic impedance material has a first acoustic impedance and the high acoustic impedance material has a second acoustic impedance. The second acoustic impedance is higher than the first acoustic impedance. Although FIG. 1G and subsequent drawings only show four layers of the acoustic wave reflective material layers of the high acoustic impedance material and the low acoustic impedance material formed alternately, any number of the acoustic wave reflective material layer of the high acoustic impedance material and the low acoustic impedance material can also be alternately formed. In some embodiments, the high acoustic impedance material may include metal, such as molybdenum, tungsten, nickel, platinum, gold, or alloys thereof, or a combination of the foregoing. In some embodiments, the low acoustic impedance material may include metal or non-metal. For example, the metal includes aluminum, titanium, or combinations thereof, and the non-metal includes semiconductor materials such as silicon, or dielectric materials such as silicon oxide ($SiO_2$), silicon nitride ($Si_3N_4$), silicon oxynitride (SiON), titanium oxide ($TiO_2$), magnesium nitride (MgN), or a combination of the foregoing.

Figure 1H:
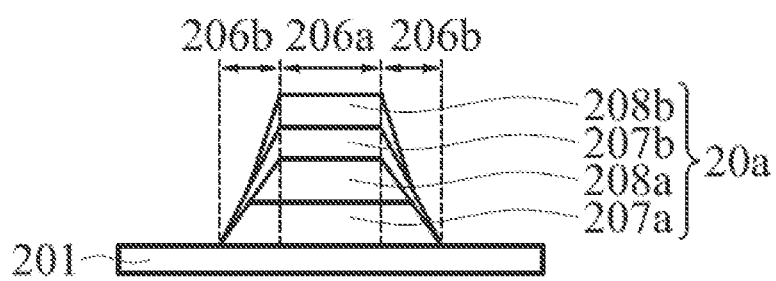

Next, referring to FIG. 1H, the lift-off process further includes removing the photoresist layer like the first photoresist layer 203 or the second photoresist layer 205 to expose the reflecting element 20a. In some embodiments, the reflecting element 20a has a tapered structure that tapers away from the second substrate 201. According to some embodiments, the reflecting element 20a may include a distributed Bragg reflector (DBR) structure, which includes the acoustic wave reflective material layers 207a, 207b, 208a, and 208b shown in FIG. 1H. In other embodiments, the DBR structure of the reflecting element 20a may include any number of the acoustic wave reflective material layers, which are composed of the low acoustic impedance material (for example, the low acoustic wave reflective material layers 207a and 207b) and the high acoustic impedance material (for example, the high acoustic wave reflective material layers 208a and 208b). In some embodiments, one layer of the acoustic wave reflective material layers in the reflecting element 20a may extend to one side of one layer of the acoustic wave reflective material layers thereunder. Specifically, as shown in FIG. 1H, the high acoustic wave reflective material layer 208b extends to one side of the low acoustic wave reflective material layer 207b, and the low acoustic wave reflective material layer 207b extends to one side of the low acoustic wave reflective material layer 207a and/or the high acoustic wave reflective material layer 208a, but the present disclosure is not limited thereto. In other embodiments, the high acoustic wave reflective material layer 208b extends to one side of the low acoustic wave reflective material layer 207b, the low acoustic wave reflective material layer 207b extends to one side of the high acoustic wave reflective material layer 208a, and the high acoustic wave reflective material layer 208a extends to one side of the low acoustic wave reflective material layer 207a.

In some embodiments, as shown in FIG. 1H, at least one of the acoustic wave reflective material layer 207a, 207b, 208a, 208b has a middle portion 206a and a surrounding portion 206b, and the thickness of the middle portion 206a is greater than the thickness of the surrounding portion 206b.

In addition, in some embodiments, the surrounding portion of the acoustic wave reflective material layer covers one side surface of one layer of the acoustic wave reflective material layer thereunder, and the thickness of the surrounding portion gradually decreases along a direction facing away from the middle portion. For example, the surrounding portion 206b of the high acoustic wave reflective material layer 208b covers a side surface of the low acoustic wave reflective material layer 207b, and the thickness of the surrounding portion 206b of the high acoustic wave reflective material layer 208b gradually decreases along a direction facing away from the middle portion 206a. The surrounding portion 206b of the low acoustic wave reflective material layer 207b covers a side surface of the high acoustic wave reflective material layer 208a and/or the low acoustic wave reflective material layer 207a, and the thickness of the surrounding portion 206b of the low acoustic wave reflective material layer 207b gradually decreases along a direction facing away from the middle portion 206a. Other acoustic wave reflective material layers can be deduced by analogy.

Figure 1I:
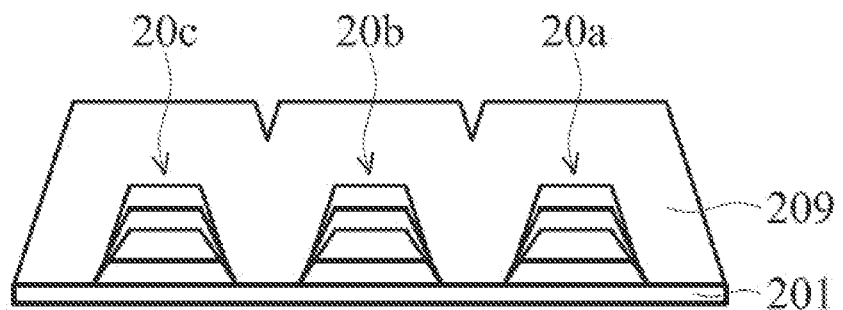

Referring to FIG. 1I, the acoustic wave reflecting part 200 further includes reflecting elements 20b and 20c. The materials and processes for forming the reflecting elements 20b and 20c can be similar to those of the reflecting element 20a, and can simultaneously form reflecting elements 20a, 20b and 20c in the same process. In addition, the reflecting elements 20a, 20b, and 20c in the acoustic wave reflecting part 200 are separated from each other. Then, a second filling material is formed on the second substrate 201, which covers side portions and top portions of the reflecting elements 20a, 20b, and 20c to form the cover layer 209. In some embodiments, the second filling material may include low acoustic impedance material. For example, the low acoustic impedance material may include metal or non-metal. For example, the metal includes aluminum, titanium, or combinations thereof, and the non-metal includes semiconductor materials such as silicon, or dielectric materials such as silicon oxide ($SiO_2$), silicon nitride ($Si_3N_4$), silicon oxynitride (SiON), titanium oxide ($TiO_2$), magnesium nitride (MgN), or a combination of the foregoing. In addition, in some embodiments, the first filling material forming the filling layer 107 may include low acoustic impedance material. According to some embodiments, the first filling material and the second filling material may include similar or identical materials.

Figure 1J:
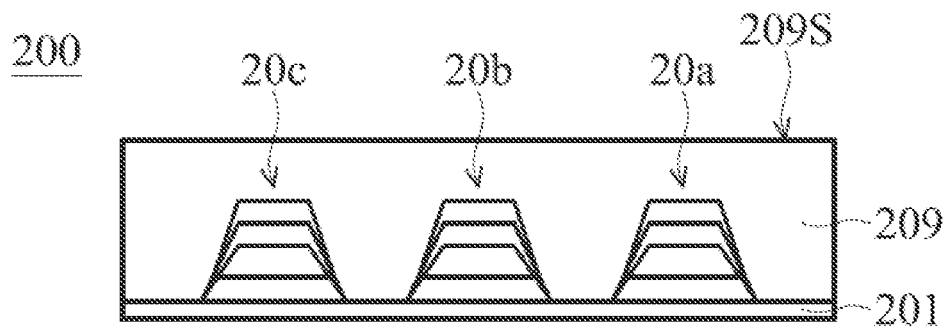

Next, as shown in FIG. 1J, after the cover layer 209 is formed, when the upper surface of the cover layer 209 is not flat, a planarization process may be performed as needed to remove part of the cover layer 209 to form a flat second bonding surface 209S. In some embodiments, the planarization process may include a chemical mechanical polishing process, a mechanical polishing process, a grinding process, an etching process, or a combination of the foregoing.

Figure 1K:
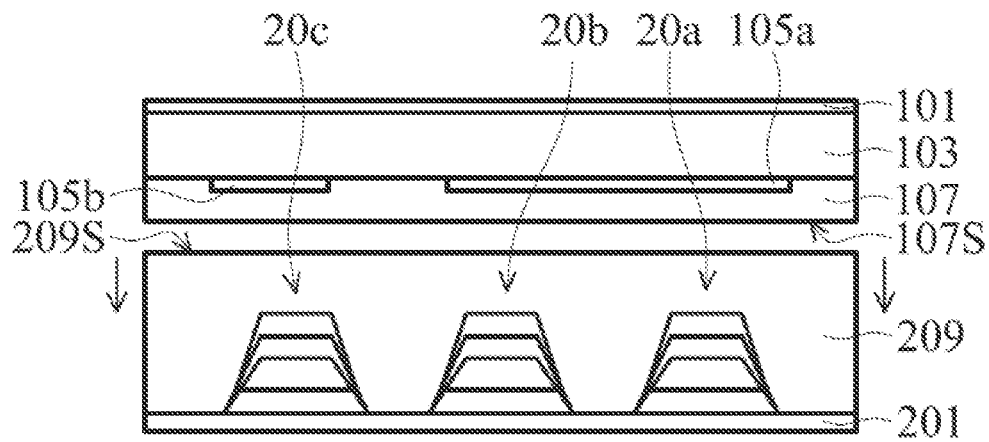
FIGS. 1K to 1N are cross-sectional views illustrating various stages in the forming process of the acoustic wave device according to some embodiments of the present disclosure.
Figure 1L:
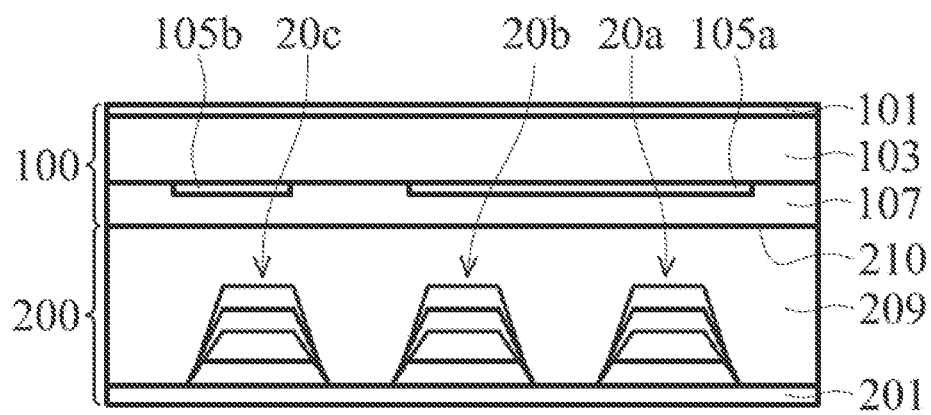

FIGS. 1K to 1N are cross-sectional views illustrating various stages in the forming process of the acoustic wave device according to some embodiments of the present disclosure. Referring to FIG. 1K or 1L, the filling layer 107 of the acoustic wave sensing part 100 and the cover layer 209 of the acoustic wave reflecting part 200 are bonded so that the acoustic wave sensing part 100 and the acoustic wave reflecting part 200 are joined with each other. In detail, the step of bonding the filling layer 107 and the cover layer 209 includes bonding the first bonding surface 107S of the filling layer 107 and the second bonding surface 209S of the cover layer 209 so that the acoustic wave sensing part 100 and the acoustic wave reflecting part 200 are joined with each other. The first bonding surface 107S and the second bonding surface 209S can be bonded by a bonding method such as oxide-oxide bonding (oxide-oxide bonding) to form the structure shown in FIG. 1L. In some embodiments, a bonding structure (not shown) can be disposed at the interface 210 between the first bonding surface 107S and the second bonding surface 209S, and the acoustic wave sensing part 100 and the acoustic wave reflecting part 200 are joined with each other through the bonding structure. As shown in FIG. 1L, in some embodiments, the first bottom electrode 105a is disposed on the reflecting elements 20a and 20b and corresponds to the reflecting elements 20a and 20b, and the second bottom electrode 105b is disposed on the reflecting element 20c and corresponds to the reflecting element 20c, but the present disclosure is not limited thereto. In other embodiments, a single bottom electrode may also be disposed on and correspond to a single reflecting element.

Figure 1M:
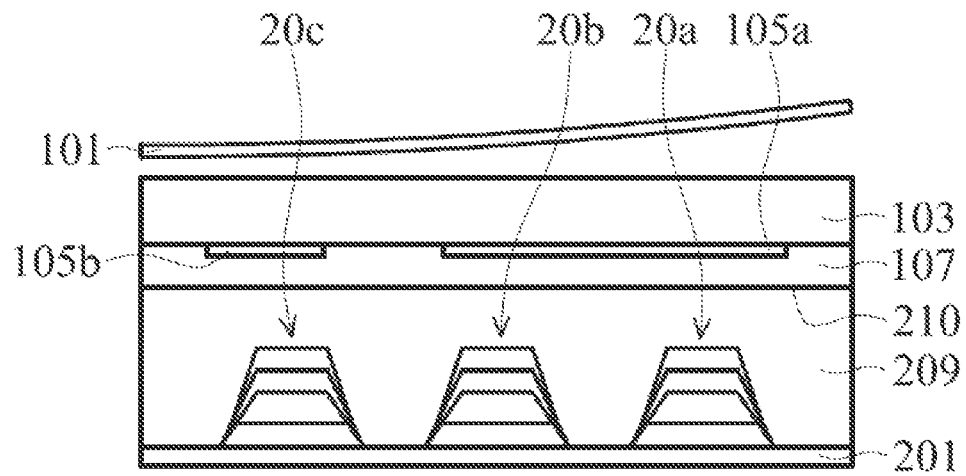
Figure 1N:
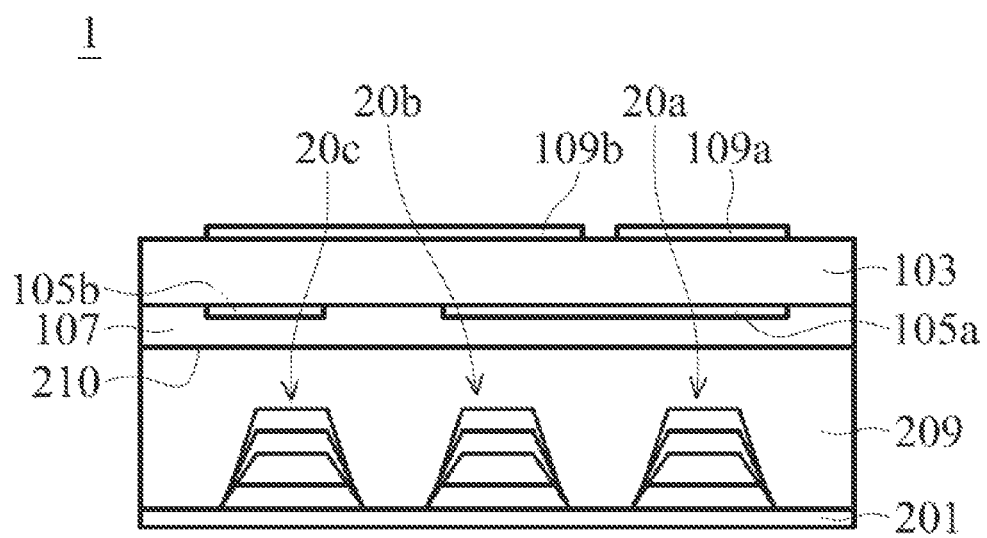

Referring to FIG. 1M, any method may be used to remove the first substrate 101 to expose the sensing layer 103. In some embodiments, a laser lift-off process can be used to remove the first substrate 101. Referring to FIG. 1N, a first top electrode 109a and a second top electrode 109b are formed on a portion of the sensing layer 103. Specifically, according to some embodiments, the material of the top electrode can be formed on the sensing layer 103, and then patterned by lithography process and etching process to form the first top electrode 109a and the second top electrode 109b as shown in FIG. 1N. In some embodiments, the first top electrode 109a and the second top electrode 109b may include titanium, tungsten, aluminum, rubidium, silver, copper, gold, molybdenum, platinum, or alloys thereof, or a combination of the foregoing. In some embodiments, the first top electrode 109a and the second top electrode 109b may include titanium tungsten alloy.

As shown in FIG. 1N, in some embodiments, the first bottom electrode 105a is disposed under and corresponds to the first top electrode 109a and the second top electrode 109b, and the second top electrode 109b is disposed on and corresponds to the first bottom electrode 105a and the second bottom electrode 105b, but the disclosure is not limited thereto. In other embodiments, a single top electrode can correspond to a single bottom electrode only or a single bottom electrode can correspond to a single top electrode only.

In one embodiment, the acoustic wave device manufactured by the above-mentioned embodiments has a plurality of reflecting elements separated from each other arranged therein. Since the existing acoustic wave device has a reflecting element having a continuous DBR structure rather than the plurality of reflecting elements discontinuously arranged along a lateral direction of the acoustic wave device as shown in FIG. 1N, parasitic capacitance is easily generated between the electrode and the underlying acoustic wave reflective material layer. In contrast, the acoustic wave device manufactured in the above embodiment has acoustic wave reflecting elements separated from each other, which can reduce the potential parasitic capacitance, thereby improving the overall performance of the acoustic wave device.

FIGS. 2A to 2I are cross-sectional views illustrating various stages in the forming process of acoustic wave part 300 according to some embodiments of the present disclosure. The difference between the embodiment shown in FIGS. 2A to 2I and the embodiment shown in FIGS. 1A to 1N is that the reflecting element is first formed on the first substrate, and then the acoustic wave part having the reflecting element and the second substrate are bonded to each other.

Figure 2A:
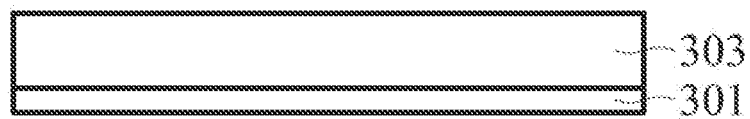
FIGS. 2A to 2I are cross-sectional views illustrating various stages in the forming process of acoustic wave part according to some embodiments of the present disclosure.

Referring to FIG. 2A, a first substrate 301 is provided, and a sensing layer 303 is formed on the first substrate 301. The material and process for forming the first substrate 301 can be similar to those of the first substrate 101 shown in FIGS. 1A to 1N, and the material and process for forming the sensing layer 303 can be the similar to those of the sensing layer 103 shown in FIGS. 1A to 1N, and the description will not be repeated here.

In addition, in the embodiment where the sensing layer 303 is a single crystal layer, a buffer layer (not shown) may be formed on the first substrate 301 first, and then the sensing layer 303 may be formed on the buffer layer. In addition, when the material of the first substrate 301 is sapphire, a sacrificial layer (not shown) can be additionally formed on the first substrate 301 wherein the sacrificial layer can be removed subsequently by laser lift-off (LLO) process, and then a buffer layer is formed on the sacrificial layer.

Figure 2B:
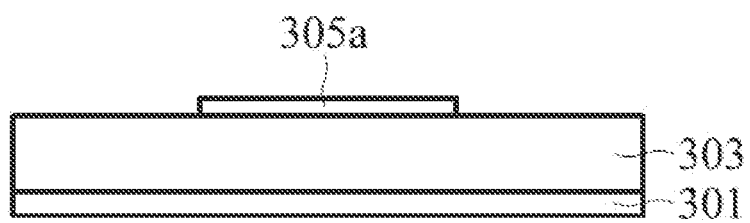

Referring to FIG. 2B, a first bottom electrode 305a is formed on part of the sensing layer 303. Although FIG. 2B only shows that a single bottom electrode 305a is formed on part of the sensing layer 303, it is also possible to form a plurality of bottom electrodes on part of the sensing layer 303, which will be described in subsequent drawings. The formation method and material of the first bottom electrode 305a can be similar to those of the first bottom electrode 105a and the second bottom electrode 105b shown in FIGS. 1A to 1N, and the description will not be repeated here.

Figure 2C:
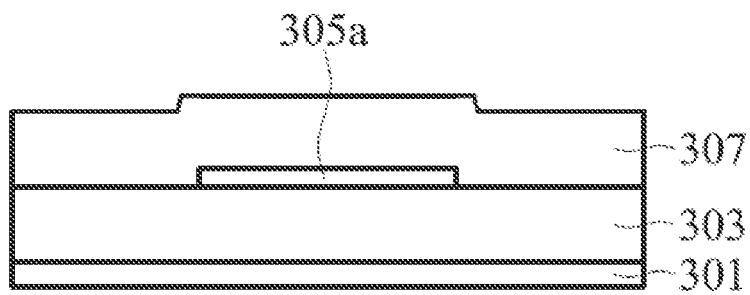
Figure 2D:
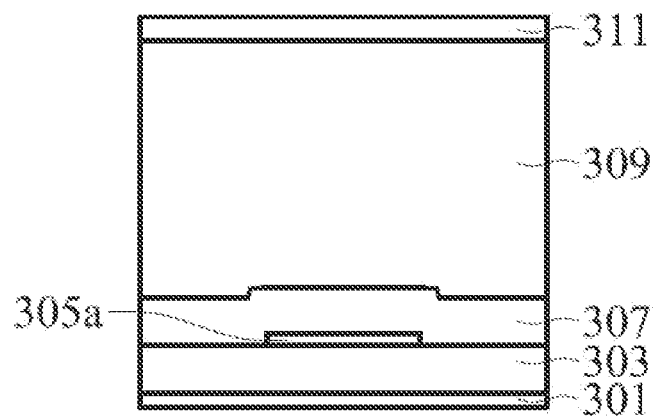

Referring to FIG. 2C, a first filling material is formed on the sensing layer 303, which covers a side portion and a top portion of the first bottom electrode 305a to form the first filling layer 307. The first filling material described herein may be similar to the first filling material in the foregoing embodiments. In some embodiments, the first filling material forming the first filling layer 307 may include low acoustic impedance material. Next, referring to FIGS. 2D to 2G, in some embodiments, the reflecting element 30a is formed on the first filling layer 307 by a lift-off process. Although FIGS. 2D to 2G only show that a single reflecting element 30a is formed on the first filling layer 307, any number of reflecting elements can be formed on the first filling layer 307, which will be described in subsequent drawings.

Figure 2E:
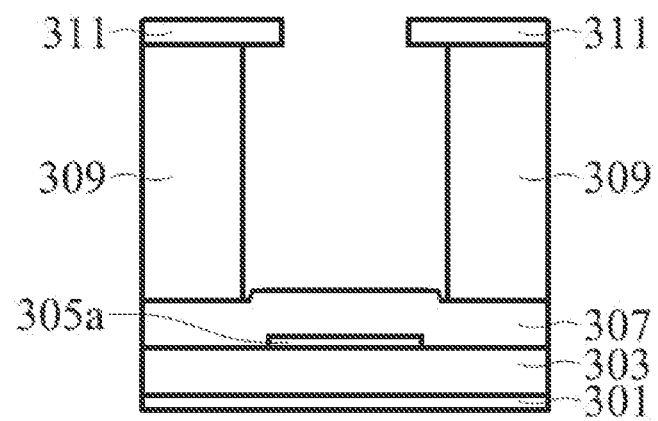

According to some embodiments, the lift-off process includes forming one photoresist layer on the first filling layer 307. In some embodiments, the photoresist layer may include a first photoresist layer 309 and a second photoresist layer 311, and the first photoresist layer 309 and the second photoresist layer 311 have different etching selectivity. Specifically, in some embodiments, a photoresist layer like the first photoresist layer 309 or the second photoresist layer 311 can be formed on the first filling layer 307 first, and the photoresist layer like the first photoresist layer 309 or the second photoresist layer 311 can be patterned to expose part of the first filling layer 307 as shown in FIG. 2E. In some embodiments, the etching rate of the lower first photoresist layer 309 may be greater than the etching rate of the upper second photoresist layer 311 so that the patterned first photoresist layer 309 is retracted relatively to the patterned second photoresist layer 311 to form an undercut structure as shown in FIG. 2E.

In some embodiments, a spin coating process, a printing process, or a combination of the foregoing may be used to form the photoresist layer, for example, the first photoresist layer 309 or the second photoresist layer 311. In addition, the photoresist layer like the first photoresist layer 309 or the second photoresist layer 311 can be patterned by lithography process. In some embodiments, the lithography process may include soft baking, hard baking, mask alignment, exposure, post-exposure baking, developing photoresist, rinsing, drying, or other processes.

Figure 2F:
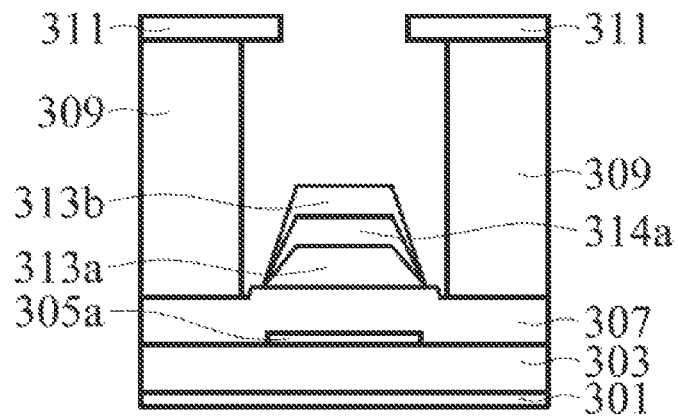

Next, referring to FIG. 2F, after forming the patterned photoresist layer, the forming process of the acoustic wave device further includes alternately forming multiple acoustic wave reflective material layers, such as a low acoustic wave reflective material layer and a high acoustic wave reflective material layer on an exposed part of the first filling layer 307. In some embodiments, the low acoustic wave reflective material layer 314a may include low acoustic impedance material, and the high acoustic wave reflective material layers 313a and 313b may include a high acoustic impedance material. The low acoustic impedance material has a first acoustic impedance, the high acoustic impedance material has a second acoustic impedance. The second acoustic impedance is higher than the first acoustic impedance. Although FIG. 2F and subsequent drawings only show three layers of the acoustic wave reflective material layers of the high acoustic impedance material and the low acoustic impedance material formed alternately, any number of the acoustic wave reflective material layers of the high acoustic impedance material and the low acoustic impedance material can also be alternately formed. The high acoustic impedance material described herein may be similar to the high acoustic impedance material described above and the low acoustic impedance material described herein may be similar to the low acoustic impedance material described above so the description will not be repeated here.

Figure 2G:
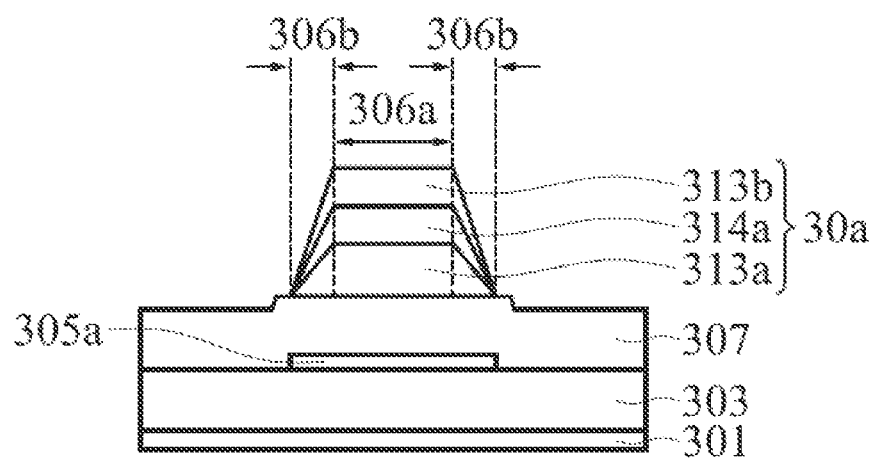

Next, referring to FIG. 2G, the lift-off process further includes removing the photoresist layer like the first photoresist layer 309 or the second photoresist layer 311 to expose the reflecting element 30a. In some embodiments, the reflecting element 30a has a tapered structure that tapers away from the first filling layer 307. According to some embodiments, the reflecting element 30a may include a distributed Bragg reflector (DBR) structure, which includes the acoustic wave reflective material layers 313a, 314a, and 313b as shown in FIG. 2G. In other embodiments, the DBR structure of the reflecting element 30a may include any number of the acoustic wave reflective material layers, which are composed of the low acoustic impedance materials (for example, the low acoustic wave reflective material layers 314a) and the high acoustic impedance materials (for example, the high acoustic wave reflective material layers 313a and 313b) alternately deposited. In some embodiments, one layer of the acoustic wave reflective material layers in the reflective element 30a may extend to one side of another layer of the acoustic wave reflective material layers thereunder. Specifically, as shown in FIG. 2G, the acoustic wave reflective material layer 313b extends to one side of the acoustic wave reflective material layer 314a, and the acoustic wave reflective material layer 314a extends to one side of the acoustic wave reflective material layer 313a. However, in some embodiment, the entire structure of the acoustic wave part will be flipped in the subsequent process, so that one layer of the acoustic wave reflective material layers of the reflecting element in the acoustic wave part extends to one side of another layer of the acoustic wave reflective material layers thereon.

In some embodiments, as shown in FIG. 2G, at least one of the acoustic wave reflective material layer 313b, 314a, 313a has a middle portion 306a and a surrounding portion 306b, and the thickness of the middle portion 306a is greater than the thickness of the surrounding portion 306b. In addition, in some embodiments, the surrounding portion of the acoustic wave reflective material layer covers a side surface of at least one layer of acoustic wave reflective material layers thereunder, and the thickness of the surrounding portion gradually decreases along a direction facing away from the middle portion. For example, the surrounding portion 306b of the acoustic wave reflective material layer 313b covers a side surface of the acoustic wave reflective material layer 314a, and the thickness of the surrounding portion 306b of the acoustic wave reflective material layer 313b gradually decreases along a direction facing away from the middle portion 306a. The surrounding portion 306b of the acoustic wave reflective material layer 314a covers a side surface of the acoustic wave reflective material layer 313a, and the thickness of the surrounding portion 306b of the acoustic wave reflective material layer 314a gradually decreases along a direction facing away from the middle portion 306a. Other acoustic wave reflective material layers can be deduced by analogy.

Figure 2H:
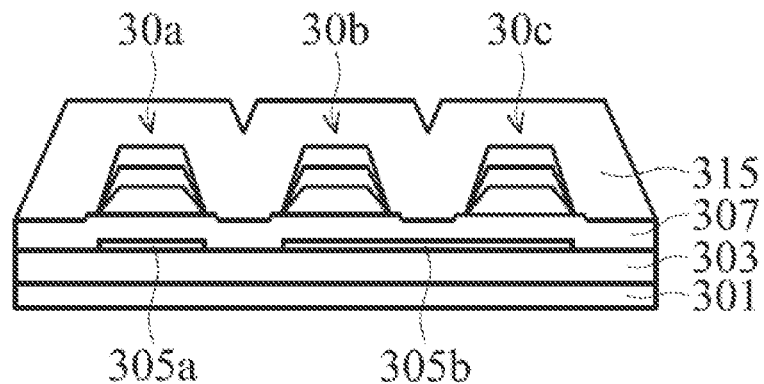

Referring to FIG. 2H, the acoustic wave reflecting part 300 further includes reflecting elements 30b and 30c. In some embodiments, the reflecting elements 30a, 30b, and 30c in the acoustic wave reflecting part 300 are separated from each other. The materials and processes for forming the reflecting elements 30b and 30c can be similar to those of the reflecting element 30a, and the reflecting elements 30a, 30b, and 30c can be formed at the same time in the same process. The reflecting elements 30b and 30c each have the same tapered structure as the reflecting element 30a, which tapers away from the first filling layer 307. The reflecting elements 30b and 30c each include a DBR structure of the reflecting element 30a. The detailed description of this structure has been described above and will not be repeated here.

Referring to FIG. 2H, the acoustic wave reflecting part 300 further includes reflecting elements 30b and 30c. In some embodiments, the reflecting elements 30a, 30b, and 30c in the acoustic wave reflecting part 300 are separated from each other. The materials and processes for forming the acoustic wave reflecting elements 30b and 30c can be similar to those of the reflecting element 30a, and the reflecting elements 30a, 30b, and 30c can be formed at the same time in the same process. The reflecting elements 30b and 30c each have the same tapered structure as the acoustic wave reflecting element 30a, which tapers away from the first filling layer 307. The acoustic wave reflecting elements 30b and 30c each include the DBR structure of the reflecting element 30a. The detailed description of this structure has been described above and will not be repeated here. Furthermore, the acoustic wave reflecting part 300 further includes a second bottom electrode 305b. The material and process for forming the second bottom electrode 305b can be similar to the first bottom electrode 305a, and the first bottom electrodes 305a and the second bottom electrode 305b can be formed in the same process. As shown in FIG. 2H, in some embodiments, the first bottom electrode 305a is disposed under the reflecting element 30a and corresponds to the reflecting element 30a, and the second bottom electrode 305b is disposed under the reflecting elements 30b and 30c and corresponds to the reflecting elements 30b and 30c. However, in some embodiments, the entire structure of the acoustic wave part will be flipped in the subsequent manufacturing process, so that the first bottom electrode 305a shown in FIG. 2H is disposed on the reflecting element 30a and corresponding to the reflecting element 30a, and the second bottom electrode 305b is disposed on the reflective elements 30b and 30c and correspond to the acoustic wave reflective elements 30b and 30c, but the present disclosure is not limited thereto. In other embodiments, a single bottom electrode may also be disposed on and correspond to a single acoustic wave reflecting element.

Referring again to FIG. 2H, a second filling material is deposited on the first filling layer 307, which covers side portions and top portions of the reflecting elements 30a, 30b, and 30c to form a cover layer 315. The second filling material described herein may be similar to the second filling material in the previous embodiment.

Figure 2I:
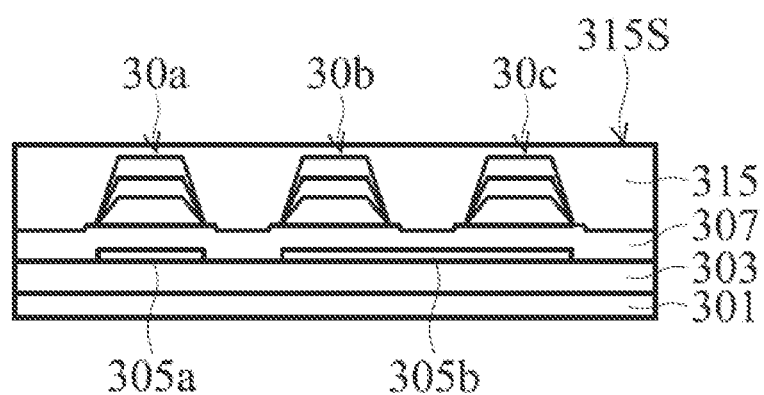

Next, as shown in FIG. 2I, when the upper surface of the cover layer 315 is not flat, a planarization process may be performed as needed to remove part of the cover layer 315 to form a flat first bonding surface 315S. In some embodiments, the planarization process may include a chemical mechanical polishing process, a mechanical polishing process, a grinding process, an etching process, or a combination of the foregoing.

Figure 2J:
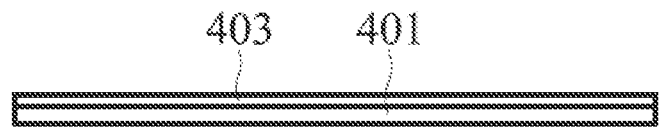
FIG. 2J is a cross-sectional view of the base part according to some embodiments of the present disclosure.

FIG. 2J is a cross-sectional view of the base part 400 according to some embodiments of the present disclosure. In some embodiments, the base part 400 includes a second substrate 401 and a second filling layer 403 formed on the second substrate 401. The material of the second substrate 401 may be similar to that of the second substrate 201 in the embodiment in FIGS. 1E to 1N. The second filling layer 403 is formed by depositing a third filling material on the second substrate 401. In some embodiments, the third filling material may include low acoustic impedance material. For example, the low acoustic impedance material may include metal or non-metal. For example, the metal includes aluminum, titanium, or combinations thereof, and the non-metal includes silicon, or dielectric materials such as silicon oxide ($SiO_2$), silicon nitride ($Si_3N_4$), silicon oxynitride (SiON), titanium oxide ($TiO_2$), magnesium nitride (MgN), or a combination of the foregoing. In some embodiments, the third filling material may include low acoustic impedance material and may be similar to or the same as the second filling material forming the cover layer 315.

Figure 2K:
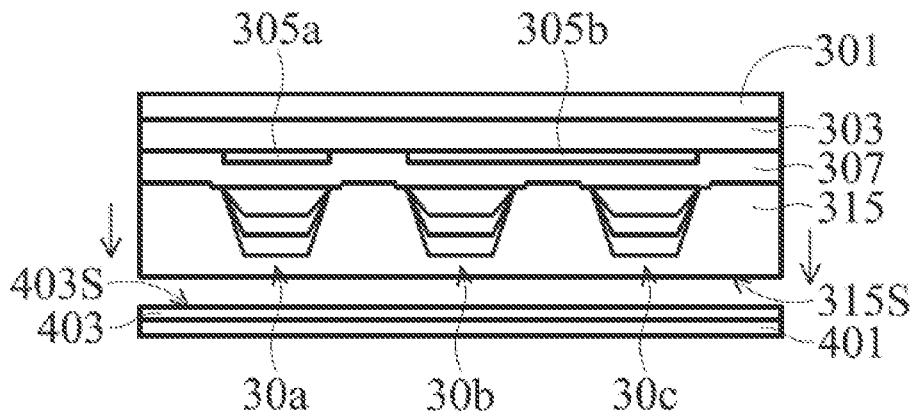
FIGS. 2K to 2N are cross-sectional views illustrating various stages of the forming process of the acoustic wave device according to some embodiments of the present disclosure.
Figure 2L:
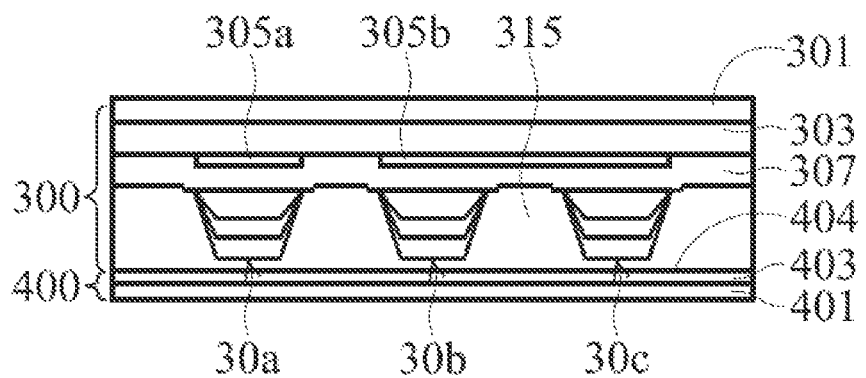

FIGS. 2K to 2N are cross-sectional views illustrating various stages of the forming process of the acoustic wave device according to some embodiments of the present disclosure. Referring to FIGS. 2K to 2L, the cover layer 315 of the acoustic wave part 300 and the second filling layer 403 of the base part 400 are bonded so that the acoustic wave part 300 and the base member 400 are joined with each other. In detail, the step of bonding the cover layer 315 and the second filling layer 403 includes bonding the first bonding surface 315S of the cover layer 315 and the second bonding surface 403S formed by the surface of the second filling layer 403 so that the acoustic wave part 300 and the base part 400 are joined with each other to form the structure shown in FIG. 3L. The first bonding surface 315S and the second bonding surface 403S can be bonded by a bonding method such as oxide-oxide bonding. In some embodiments, a bonding structure (not shown) can be disposed at the interface 404 between the first bonding surface 315S and the second bonding surface 403S, and the acoustic wave part 300 and the base part 400 are joined with each other through the bonding structure.

Figure 2M:
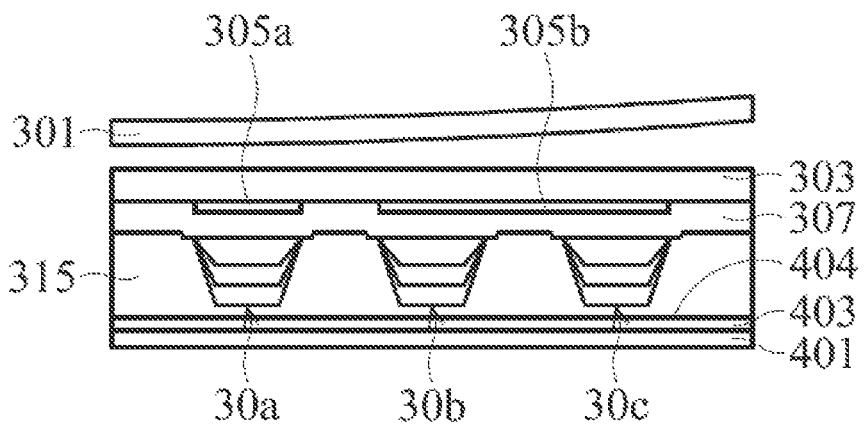
Figure 2N:
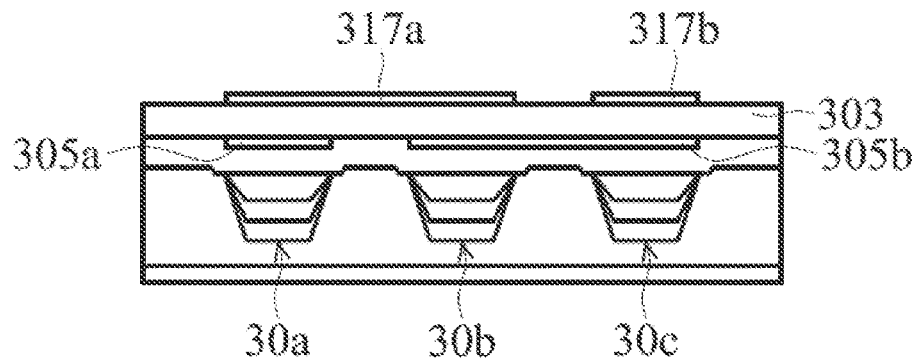
Figure 3A:
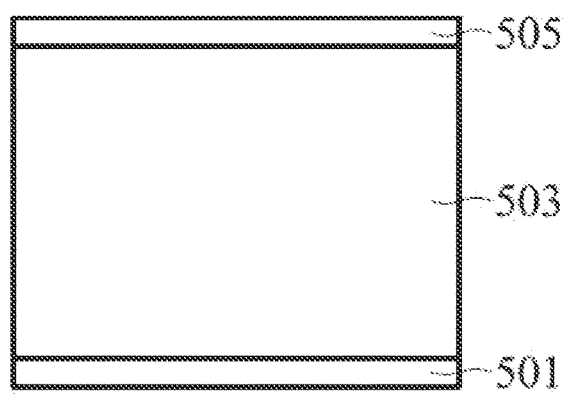
FIGS. 3A to 3I are cross-sectional views illustrating various stages in the manufacturing process of the acoustic wave device according to some embodiments of the present disclosure.

Next, referring to FIG. 2M, a suitable method may be used to remove the first substrate 301 to expose the sensing layer 303. In some embodiments, a laser lift-off process can be used to remove the first substrate 301. Referring to FIG. 2N, a first top electrode 317a and a second bottom electrode 317b are formed on part of the sensing layer 303. Specifically, according to some embodiments, the top electrodes may be formed on the sensing layer 303 and then may be patterned by lithography process and etching process to form the material as the top electrode 317a and the bottom electrode 317b shown in FIG. 2N. In some embodiments, the top electrode 317a and the bottom electrode 317b may include titanium, tungsten, aluminum, rubidium, silver, copper, gold, molybdenum, platinum or alloys thereof, or a combination thereof. In some embodiments, the top electrode 317a and the bottom electrode 317b include titanium tungsten alloy.

As shown in FIG. 2N, in some embodiments, the first top electrode 317a is disposed on and corresponds to the first bottom electrode 305a and the second bottom electrode 305b, and the bottom electrode 305b is disposed under correspond to the first top electrode 317a and the second top electrode 317b, but the disclosure is not limited thereto. In other embodiments, a single top electrode can correspond to a single bottom electrode only or a single bottom electrode can correspond to a single top electrode only.

In one embodiment, the acoustic wave device manufactured by the above-mentioned embodiment has plurality of reflecting elements separated from each other arranged therein. Since the existing acoustic wave device has a reflecting element having a continuous DBR structure rather than the plurality of reflecting elements discontinuously arranged along a lateral direction of the acoustic wave device as shown in FIG. 1N, parasitic capacitance is easily generated between the electrode and the underlying acoustic wave reflective material layer. In contrast, the acoustic wave device manufactured in the above embodiment has reflecting elements separated from each other, which can reduce the potential parasitic capacitance, thereby improving the overall performance of the acoustic wave device.

FIGS. 3A to 3I are cross-sectional views illustrating various stages in the forming process of the acoustic wave device according to some embodiments of the present disclosure. The difference between the embodiment shown in FIGS. 3A to 3I and the embodiment shown in FIGS. 1A to 1N is that no bonding step is required, and the bottom electrode is etched to have a tapered structure.

Referring to FIGS. 3A to 3D, the reflecting element 50a is formed on the substrate 501 by a lift-off process. Although FIGS. 3A to 3D only show that a single reflecting element 50a is formed on the substrate 501, any number of reflecting elements can be formed on the substrate 501, which will be described in subsequent drawings. The material and process for forming the substrate 501 can be similar to those of the first substrate 101 shown in FIGS. 1A to 1N, and the description will not be repeated here.

Figure 3B:
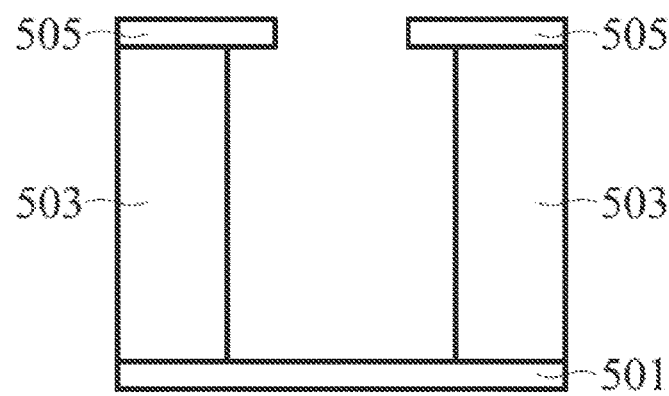

According to some embodiments, the lift-off process includes forming at least one photoresist layer on the substrate 501. In some embodiments, the photoresist layer may include a first photoresist layer 503 or a second photoresist layer 505, and the first photoresist layer 503 and the second photoresist layer 505 have different etching selectivity. Specifically, in some embodiments, a photoresist layer like the first photoresist layer 503 or the second photoresist layer 505 may be formed on the substrate 501 first, and the photoresist layer like the first photoresist layer 503 or the second photoresist layer 505 may be patterned to expose part of the substrate 501. In some embodiments, the etching rate of the lower first photoresist layer 503 may be greater than the etching rate of the upper second photoresist layer 505 so that the patterned first photoresist layer 503 is retracted relatively to the second photoresist layer 505 to form an undercut structure as shown in FIG. 3B.

In some embodiments, the photoresist layer like the first photoresist layer 503 and the second photoresist layer 505 may be formed by a spin coating process, a printing process, or a combination of the foregoing. In addition, the photoresist layer like the first photoresist layer 503 and the second photoresist layer 505 can be patterned by lithography process. In some embodiments, the lithography process may include soft baking, hard baking, mask alignment, exposure, post-exposure baking, developing photoresist, rinsing, drying, or other processes.

Figure 3C:
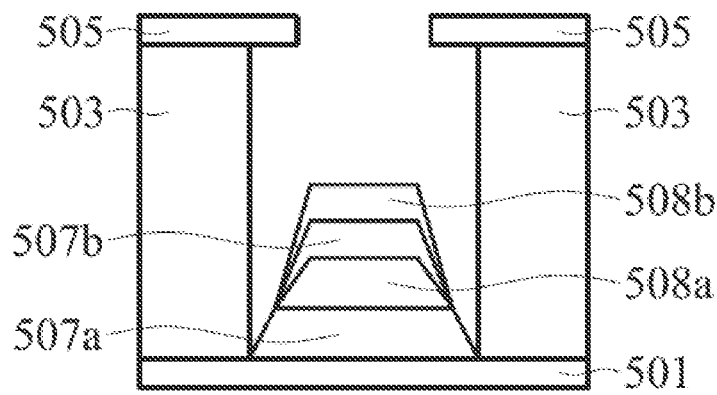

Next, referring to FIG. 3C, after forming the patterned photoresist layer, the forming process of the acoustic wave device further includes alternately depositing multiple acoustic wave reflective material layers, such as a low acoustic wave reflective material layer and a high acoustic wave reflective material layer on a part of the exposed substrate 501. In some embodiments, the low acoustic wave reflective material layers 507a and 507b may include low acoustic impedance material, and the high acoustic wave reflective material layers 508a and 508b may include high acoustic impedance material. The low acoustic impedance material has a first acoustic impedance and the high acoustic impedance material has a second acoustic impedance. The second acoustic impedance is higher than the first acoustic impedance. Although FIG. 3C and subsequent drawings only show four layers of the acoustic wave reflective material layers of the high acoustic impedance material and the low acoustic impedance material formed alternately, any number of the acoustic wave reflective material layer of the high acoustic impedance material and the low acoustic impedance material can also be alternately formed. The high acoustic impedance material described herein may be similar to the high acoustic impedance material described above, and the low acoustic impedance material described herein may be similar to the low acoustic impedance material described above, and the description will not be repeated here.

Figure 3D:
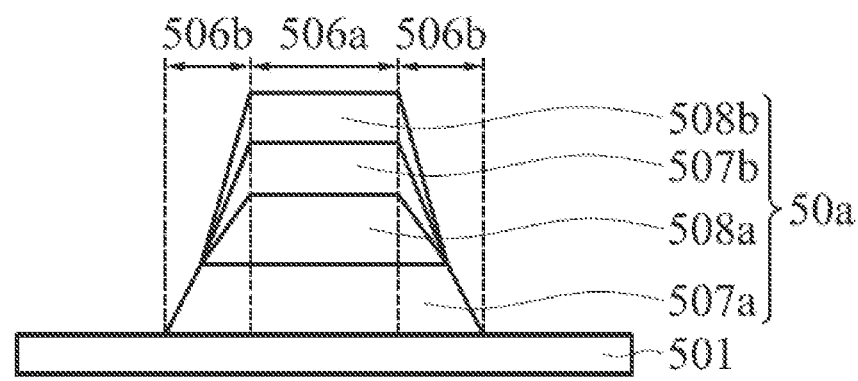

Next, referring to FIG. 3D, the lift-off process further includes removing the photoresist layer like the first photoresist layer 503 or the second photoresist layer 505 to expose the reflecting element 50a. In some embodiments, the reflecting element 50a has a tapered structure that tapers away from the substrate 501. According to some embodiments, the reflecting element 50a may include a DBR structure, which includes the acoustic wave reflective material layers 507a, 508a, 507b, and 508b as shown in FIG. 3D. In other embodiments, the DBR structure of the reflecting element 50a may include any number of the acoustic wave reflective material layers, which are composed of the low acoustic impedance materials (for example, the low acoustic wave reflective material layers 507a and 507b) and the high acoustic impedance materials alternately deposited. (For example, the high acoustic wave reflective material layers 508a and 508b). In some embodiments, one layer of the acoustic wave reflective material layers in the reflecting element 50a can extend to one side of one layer of the acoustic wave reflective material layers thereunder. Specifically, as shown in FIG. 3D, the acoustic wave reflective material layer 508b extends to one side of the low acoustic wave reflective material layer 507b, and the low acoustic wave reflective material layer 507b extends to one side of the high acoustic wave reflective material layer 508a, but the present disclosure is not limited thereto. In other embodiments, the high acoustic wave reflective material layer 508b extends to one side of the low acoustic wave reflective material layer 507b, the low acoustic wave reflective material layer 507b extends to one side of the high acoustic wave reflective material layer 508a, and the high acoustic wave reflective material layer 508a extends to one side of the low acoustic wave reflective material layer 507a.

In some embodiments, as shown in FIG. 3D, at least one of the acoustic wave reflective material layer 507a, 507b, 508a, 508b has a middle portion 506a and a surrounding portion 506b, and the thickness of the middle portion 506a is greater than the thickness of the surrounding portion 506b. In addition, in some embodiments, the surrounding portion of the acoustic wave reflective material layer covers one side surface of at least one layer of acoustic wave reflective material layer thereunder, and the thickness of the surrounding portion gradually decreases along a direction facing away from the middle portion. For example, the surrounding portion 506b of the acoustic high wave reflective material layer 508b covers a side surface of the low acoustic wave reflective material layer 507a, and the thickness of the surrounding portion 506b of the high acoustic wave reflective material layer 508b gradually decreases along a direction facing away from the middle portion 506a. The surrounding portion 506b of low the acoustic wave reflective material layer 507b covers a side surface of the high acoustic wave reflective material layer 508a, and the thickness of the surrounding portion 506b of the low acoustic wave reflective material layer 507b gradually decreases along a direction facing away from the middle portion 506a. Other acoustic wave reflective material layers can be deduced by analogy.

Figure 3E:
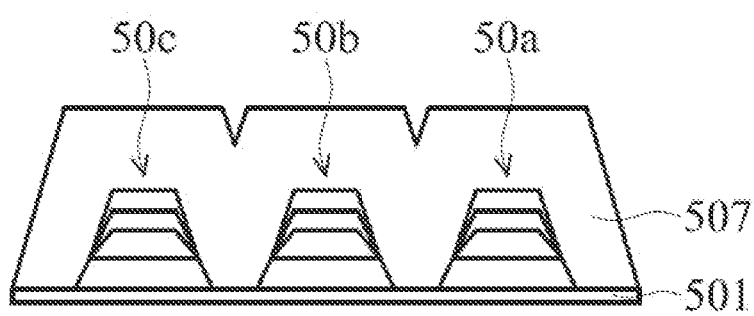

Referring to FIG. 3E, in addition to the reflecting element 50a, FIG. 3E further illustrates that the reflecting elements 50b and 50c are disposed therein. In some embodiments, the reflecting elements 50a, 50b, and 50c are separated from each other. The reflecting elements 50b and 50c each have the same tapered structure as the reflecting element 50a, which tapers away from the substrate 501. The reflecting elements 50b and 50c each include the DBR structure of the reflecting element 50a. The detailed description of this structure has been described above and will not be repeated here. The materials and processes for forming the reflecting elements 50b and 50c can be similar to those of the reflecting element 50a, and the reflecting elements 50a, 50b, and 50c can be formed at the same time in the same process. Next, referring to FIG. 3E again, a filling material is formed on the substrate 501 to cover side portions and top portions of the reflecting elements 50a, 50b, and 50c to form a cover layer 507. In some embodiments, the filling material forming the cover layer 507 may include low acoustic impedance material. For example, the low acoustic impedance material may include metal or non-metal. For example, the metal includes aluminum, titanium, or combinations thereof, and the non-metal include silicon, or dielectric materials such as silicon oxide ($SiO_2$), silicon nitride ($Si_3N_4$), silicon oxynitride (SiON), titanium oxide ($TiO_2$), and magnesium nitride (MgN), or a combination of the foregoing.

Figure 3F:
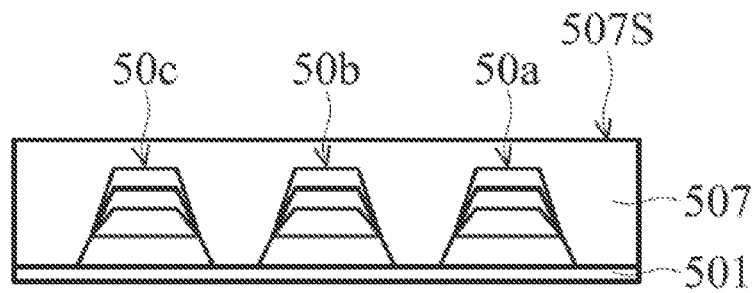

Next, as shown in FIG. 3F, when the upper surface of the cover layer 507 is not flat, a planarization process may be performed as needed to remove part of the cover layer 507 to form a flat top surface 507S. In some embodiments, the planarization process may include a chemical mechanical polishing process, a mechanical polishing process, a grinding process, an etching process, or a combination of the foregoing. However, in other embodiments, after the cover layer 507 is formed, the cover layer 507 may not be subjected to a planarization process.

Figure 3G:
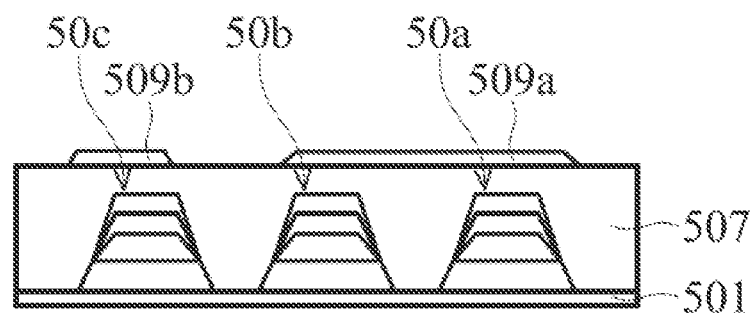

Next, referring to FIG. 3G, a first bottom electrode 509a and a second bottom electrode 509b are formed on part of the cover layer 507. The formation method and material of the first bottom electrode 509a and the second bottom electrode 509b can be the same as or similar to those of the first bottom electrode 105a and the second bottom electrode 105b shown in FIGS. 1A to 1N, and the description will not be repeated here. In some embodiments, the method for forming the first bottom electrode 509a and the second bottom electrode 509b may further include using any dry etching process to remove part of the first bottom electrode 509a and the second bottom electrode 509b to have a tapered structure that tapers away from the substrate 501, as shown in FIG. 3G. In some embodiments, a dry etching process may include a reactive ion etching process, a plasma etching process, or a combination of the foregoing. The tapered structure of the bottom electrodes 509a and 509b in this embodiment can prevent the sensing layer deposited subsequently from cracking at the interface between the sensing layer and the bottom electrode, and form a relatively complete structure.

As shown in FIG. 3G, the first bottom electrode 509a is disposed on the reflecting elements 50a and 50b and corresponds to the reflecting elements 50a and 50b, and the second bottom electrode 509b is disposed on the reflecting element 50c and corresponds to the reflecting element 50c, but the present disclosure is not limited thereto. In other embodiments, a single bottom electrode may also be disposed on a single reflecting element, and correspond to a single reflecting element.

Figure 3H:
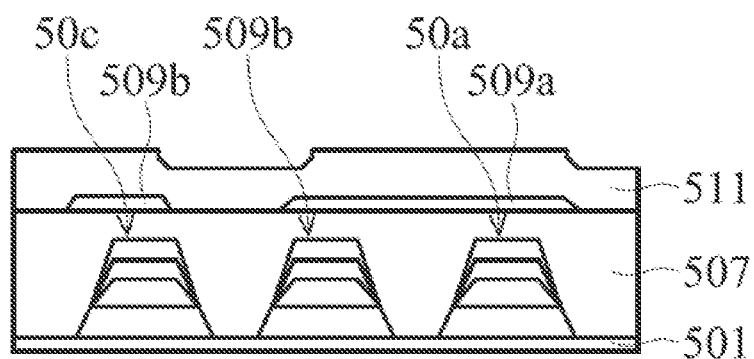

Next, referring to FIG. 3H, a sensing layer 511 is formed on the cover layer 507. In some embodiments, the sensing layer 511 can be formed by pulsed laser deposition, sputtering deposition, or a combination of the foregoing. The material of the sensing layer 511 may be similar to the material of the sensing layer 103 in the foregoing embodiment, and the description will not be repeated here. In this embodiment, the planarization process may not be performed, and the upper surface of the cover layer is retained as an uneven surface.

Figure 3I:
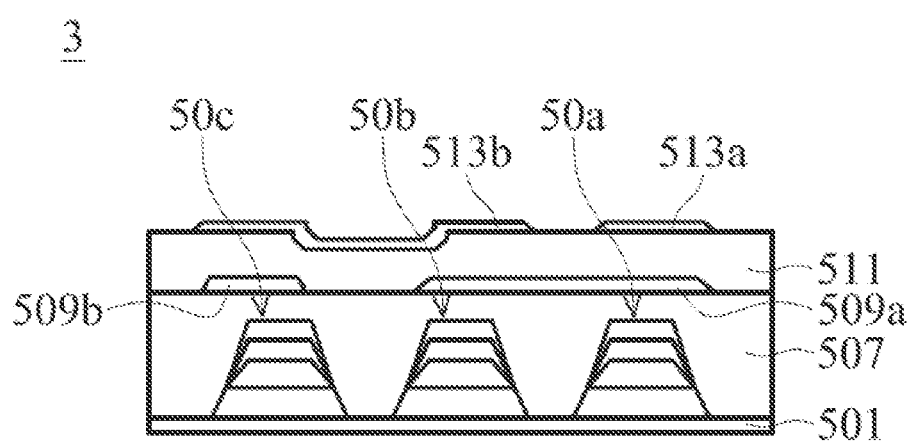

Referring to FIG. 3I, a first top electrode 513a and a second top electrode 513b are formed on a portion of the sensing layer 511. Specifically, according to some embodiments, the material of the top electrode can be formed on the sensing layer 511, and then patterned by lithography process and etching process to form the first top electrode 513a and the second top electrode 513b as shown in FIG. 3I. In some embodiments, the first top electrode 513a and the second top electrode 513b may include titanium, tungsten, aluminum, rubidium, silver, copper, gold, molybdenum, platinum, or alloys thereof, or a combination of the foregoing. In some embodiments, the first top electrode 513a and the second top electrode 513b may include titanium tungsten alloy.

As shown in FIG. 3I, in some embodiments, the first bottom electrode 509a is disposed on and corresponds to the first top electrode 513a and the second top electrode 513b, and the second top electrode 513b is disposed on and corresponds to the first bottom electrodes 509a and the second bottom electrode 509b, but the present disclosure is not limited thereto. In other embodiments, a single top electrode can correspond to a single bottom electrode, or a single bottom electrode can correspond to a single top electrode.

In one embodiment, the acoustic wave device manufactured by the above-mentioned embodiment has a plurality of reflecting elements separated from each other arranged therein. Since the existing acoustic wave device has a reflecting element having a continuous DBR structure rather than the plurality of reflecting elements discontinuously arranged along a lateral direction of the acoustic wave device as shown in FIG. 3I, it is easier to generate parasitic capacitance in the circuit. In contrast, the acoustic wave device provided by the embodiment of the present disclosure has reflecting elements separated from each other, which can reduce the potential parasitic capacitance, thereby improving the overall performance of the acoustic wave device. In addition, the bottom electrode of the manufactured acoustic wave device has a tapered structure so that the subsequently formed sensing layer does not crack at the interface between the sensing layer and the bottom electrode, and a relatively complete structure is formed.

The components of several embodiments are summarized above, so that those with ordinary knowledge in the technical field of the present disclosure can more easily understand the viewpoints of the embodiments of the present disclosure. Those with ordinary knowledge in the technical field of the present disclosure should understand that they can design or modify other manufacturing processes and structures based on the embodiments of the present disclosure to achieve the same purpose and/or advantages as the embodiments described herein. Those with ordinary knowledge in the technical field to which the present disclosure pertains should also understand that such equivalent manufacturing processes and structures do not depart from the spirit and scope of the present disclosure, and they can do so without departing from the spirit and scope of the present disclosure. Use all kinds of changes, substitutions and replacements.

What is claimed is:

1. An acoustic wave device, comprising:
    a substrate;
    a reflecting element disposed on the substrate;
    a sensing layer disposed on the reflecting element; and
    a top electrode disposed on the sensing layer and corresponding to the reflecting element;
    wherein the reflecting element comprises multiple acoustic reflective material layers, each of the multiple acoustic reflective material layers comprises a middle portion and a surrounding portion, the middle portion has a first thickness, the surrounding portion has a second thickness, and the first thickness is greater than the second thickness, and
    wherein one of the multiple acoustic reflective material layers extends to and covers the surrounding portion of another one of the multiple acoustic reflective material layers thereunder.

2. The acoustic wave device according to claim 1, wherein the reflecting element has a tapered structure that tapers away from or close to the substrate.

3. The acoustic wave device according to claim 1, wherein the second thickness of the surrounding portion gradually decreases along a direction facing away from the middle portion.

4. The acoustic wave device according to claim 1, further comprising a cover layer, wherein the cover layer is located between the substrate and the sensing layer, the reflecting element is covered by the cover layer, the cover layer comprises a low acoustic impedance material.

5. The acoustic wave device according to claim 1, wherein the multiple acoustic reflective material layers of the reflecting element comprise a low acoustic wave reflective material layer and a high acoustic wave reflective material layer, the low acoustic wave reflective material layer has a first acoustic impedance, the high acoustic wave reflective material layer has a second acoustic impedance, the second acoustic impedance is greater than the first acoustic impedance.

6. The acoustic wave device according to claim 5, wherein the reflecting element comprises a DBR structure, and the DBR structure is formed by the multiple acoustic reflective material layers comprising a plurality of the low acoustic wave reflective material layer and the high acoustic wave reflective material layer alternatively deposited.

7. The acoustic wave device according to claim 1, further comprising a bottom electrode corresponding to the reflecting element, wherein the bottom electrode has a tapered structure that tapers away from the substrate.

8. The acoustic wave device according to claim 1, further comprising a bonding structure disposed between the reflecting element and the sensing layer.

9. The acoustic wave device according to claim 1, further comprising a bonding structure disposed between the substrate and the reflecting element.

10. The acoustic wave device according to claim 1, further comprising a plurality of reflecting elements comprising the reflecting element, wherein the plurality of reflecting elements are separated from each other.

11. The acoustic wave device according to claim 10, further comprising a plurality of bottom electrodes disposed between the sensing layer and the plurality of reflecting elements which is disposed corresponding to the plurality of bottom electrodes.

12. The acoustic wave device according to claim 5, wherein the high acoustic wave reflective material layer comprises molybdenum, tungsten, nickel, platinum, gold, or an alloy thereof, and/or the low acoustic wave reflective material layer comprises silicon oxide, silicon nitride, silicon oxynitride, titanium oxide, magnesium nitride, or a combination thereof.

* * * * *